United States Patent [19]

Lynch

[11] 4,091,360
[45] May 23, 1978

[54] DYNAMIC PRECHARGE CIRCUITRY

[75] Inventor: William Thomas Lynch, Summit, N.J.

[73] Assignee: Bell Telephone Laboratories, Incorporated, Murray Hill, N.J.

[21] Appl. No.: 719,445

[22] Filed: Sep. 1, 1976

[51] Int. Cl.² ............................................. G11C 7/00
[52] U.S. Cl. ................................. 340/166 R; 365/203
[58] Field of Search ...................... 340/166 R, 173 R; 235/152

[56] References Cited

U.S. PATENT DOCUMENTS

| 3,720,925 | 3/1973 | Ross | 340/166 R |
| 3,816,725 | 6/1974 | Greer | 340/166 R |
| 3,914,620 | 10/1975 | Millhollan | 340/166 R |

Primary Examiner—Harold I. Pitts

Attorney, Agent, or Firm—Irwin Ostroff

[57] ABSTRACT

In MOS circuitry, such as a dynamic MOS random access memory, precharge circuitry, consisting of six p-channel MOS transistors and a seventh p-channel MOS transistor connected as a capacitor, facilitates a two step charging process that initially lowers the potential of a first circuit node from a high potential to a value approximately one threshold voltage above an available low level power supply potential and then further lowers the potential of the circuit node to a value below that of the available low level power supply potential. A single voltage pulse and the complement thereof are the only input signals required. Normal threshold voltage losses of MOS transistors can thus be effectively eliminated and noise margins thereby improved.

9 Claims, 2 Drawing Figures

DYNAMIC PRECHARGE CIRCUITRY

BACKGROUND OF THE INVENTION

This invention relates to MOS voltage precharge circuitry which is useful with many of today's dynamic MOS memory systems.

The use of an MOS transistor with the drain and the gate connected together to a precharge voltage pulse generator is well known for setting the potential of an address select line (of a dynamic p-channel MOS memory) connected to the source to one threshold voltage level above the low voltage level of the voltage pulse generator. One problem with this technique is that the potential of the address select line cannot be set closer than one threshold potential above the low voltage level of the voltage pulse generator. Accordingly, noise margin and transistor geometry are adversely affected.

One possible method for dynamically setting the potential of an address select line of a p-channel MOS memory system to a value which is equal to the lowest available level of a pulse generator is to use an MOS transistor with a "bootstrap" capacitor between the source and gate. The drain and source of the transistor are connected to a voltage pulse generator and an address select line, respectively. The potential of the gate is first dynamically set to one threshold level above the lowest power supply potential, and then thereafter the drain of the transistor is typically pulsed from a high power supply potential level to the lowest available power supply. As the source charges towards the drain potential, charge is coupled from the source via the capacitor to "bootstrap" the gate to a more negative level. The use of a sufficient size capacitor allows the lowering of the potential of the gate to at least one threshold level below that of the potential of the lowest available power supply. This permits the source to reach a potential that is equal to that of the lowest power supply. One problem with this method is that an additional input signal and additional timing requirements are placed on the entire system.

Another possible method of achieving the desired result is to use a first p-channel MOS transistor with the drain and gate connected together to a first voltage pulse generator and the source connected to an address select line. A first terminal of a capacitor is connected to the source and the second terminal is connected to a second voltage pulse generator. The gate and drain of the transistor are first pulsed to the potential level of the lowest available power supply. This sets the address select line potential to one threshold voltage above the lowest available power supply. A negative going voltage waveform is then applied to the second terminal of the capacitor to further lower the potential of the source. This allows the potential of the address select line to be lowered to a value which can be less than that of the lowest available power supply potential. One of the problems with this method is that it requires a separate capacitor for each circuit node to be set in potential. It also adds timing requirements and, in addition, the extra capacitance loads down the voltage pulse generators connected thereto.

It would be desirable to have precharge circuitry which can be utilized for simultaneously precharging many circuit nodes, which does not require a separate capacitor per node, and which requires essentially only one external input voltage pulse.

SUMMARY OF THE INVENTION

Viewed from one aspect, the present invention is precharge circuitry which comprises essentially two points for effecting two step charging of the select lines. In the first step the charging occurs through a plurality of precharging MOS transistors whose gates are all connected to the source of an MOS transistor whose gate is connected to a first voltage generator. In the second step, the above-mentioned source receives a capacitive bootstrap charging from a second part of the circuit which has a delayed turn-on. This charging strongly turns on all of the precharging transistors and the select lines rapidly charge to the supply voltage.

Viewed from a different aspect, the present invention is precharge circuitry which comprises essentially first circuit means and second circuit means. The first circuit means is connected to an output terminal of the precharge circuitry and is coupled to available power supplies. The second circuit means is coupled through capacitive means to the output terminal. In response to an input signal or the complement thereof, in a p-channel embodiment, the first circuit means causes the output terminal to be set to a first potential which is approximately one threshold voltage above the potential of a low voltage power supply used with the precharge circuitry. In response to the same signal, in an n-channel embodiment, the first circuit means causes the output terminal to be set to a first potential which is approximately one threshold voltage below the potential of a high voltage power supply used with the precharge circuitry. After the output terminal is set to the first potential, the second circuit means, in a delayed response to the same input signal or the complement thereof, causes the output terminal to be set to a second potential which is more negative (for p-channel embodiment) or more positive (for n-channel embodiment) than the potential of the appropriate power supply.

In one embodiment of the present invention, the precharge circuitry comprises first and second switching devices which each have a control terminal and first and second output terminals, a capacitor, and first, second, third, and fourth voltage setting circuit means. In a preferred embodiment the two switching devices, the capacitor and the four voltage setting circuit means each comprise a separate MOS transistor. The capacitor utilizes the gate of an MOS transistor as one terminal and the source and drain as the other.

The source of the transistor of the first voltage setting circuit means and the drain of the transistor of the second voltage setting circuit means are connected to the gate of the first switching means and to an output terminal. The source of the transistor of the third voltage setting circuit means and the drain of the transistor of the fourth voltage setting circuit means are connected to the gate of the second switching device.

In a preferred embodiment the electrical characteristics of the transistors of the first and fourth voltage setting circuit means are selected such that the response time of the gate of the second switching device to switch from a low value to a high value is longer than the response time of the gate of the first switching device to switch from a high value to a low value. In addition the transconductance of the second switching device is selected to be greater than that of the first switching device.

The gate of the MOS transistor which serves as a capacitor is connected to the gate of the first switching device. The drain and source thereof are connected to the source of the first switching device and the drain of the second switching device. The gates of the transistors of the first and fourth voltage setting circuit means and the drain of the first switching device are all connected to a voltage pulse source which generates a signal that is denoted as PRECH. The gates of the transistors of the second and third voltage setting circuit means are connected to a voltage pulse source denoted as $\overline{\text{PRECH}}$. $\overline{\text{PRECH}}$ is essentially an inverted PRECH signal. The drains of the transistors of the first and third voltage setting circuit means are connected to a low voltage power supply. The sources of the transistors of the second and fourth voltage setting circuit means and the source of the second switching device are all connected to a high voltage power supply.

The gate of at least one other MOS transistor is connected to the output terminal of the precharge circuitry. The drain of this transistor is typically connected to the low voltage power supply and the source is connected to a circuit node that is to be periodically charged via this transistor to the potential of the low power supply. This circuit node, which is typically part of a dynamic memory system, can also be periodically charged via another transistor(s) to the potential of the high voltage power supply.

The output terminal of the precharge circuitry is first set to a potential of approximately one threshold voltage above the potential of the low power supply, and then thereafter the output terminal is automatically negatively pulsed to a potential level which is at least one threshold voltage below that of the potential of the low power supply. The gate of the transistor connected to the output terminal is thus set in potential to at least one threshold voltage below the potential of the low power supply. The source of this transistor now assumes the potential level of the drain which is connected to the low power supply. Accordingly, noise margins are increased because the available signal levels at the source of this transistor are now the full low level of the low voltage power supply and the full high level of the high voltage power supply. Threshold voltage losses which normally would effectively condense the differential voltage levels of the power supplies are thus effectively eliminated. If desired, the potential difference between the high and low voltage power supplies can be reduced and noise margin can be maintained. In addition, a greater source-to-gate potential is available to transistors of the memory system. This allows for a greater current flow therethrough or alternately allows for a reduction in the size of the transistor(s) while maintaining the same current flow therethrough.

These and other features and advantages of the invention will be better understood from a consideration of the following detailed description taken in conjunction with the following drawings.

DETAILED DESCRIPTION

Figure 1:
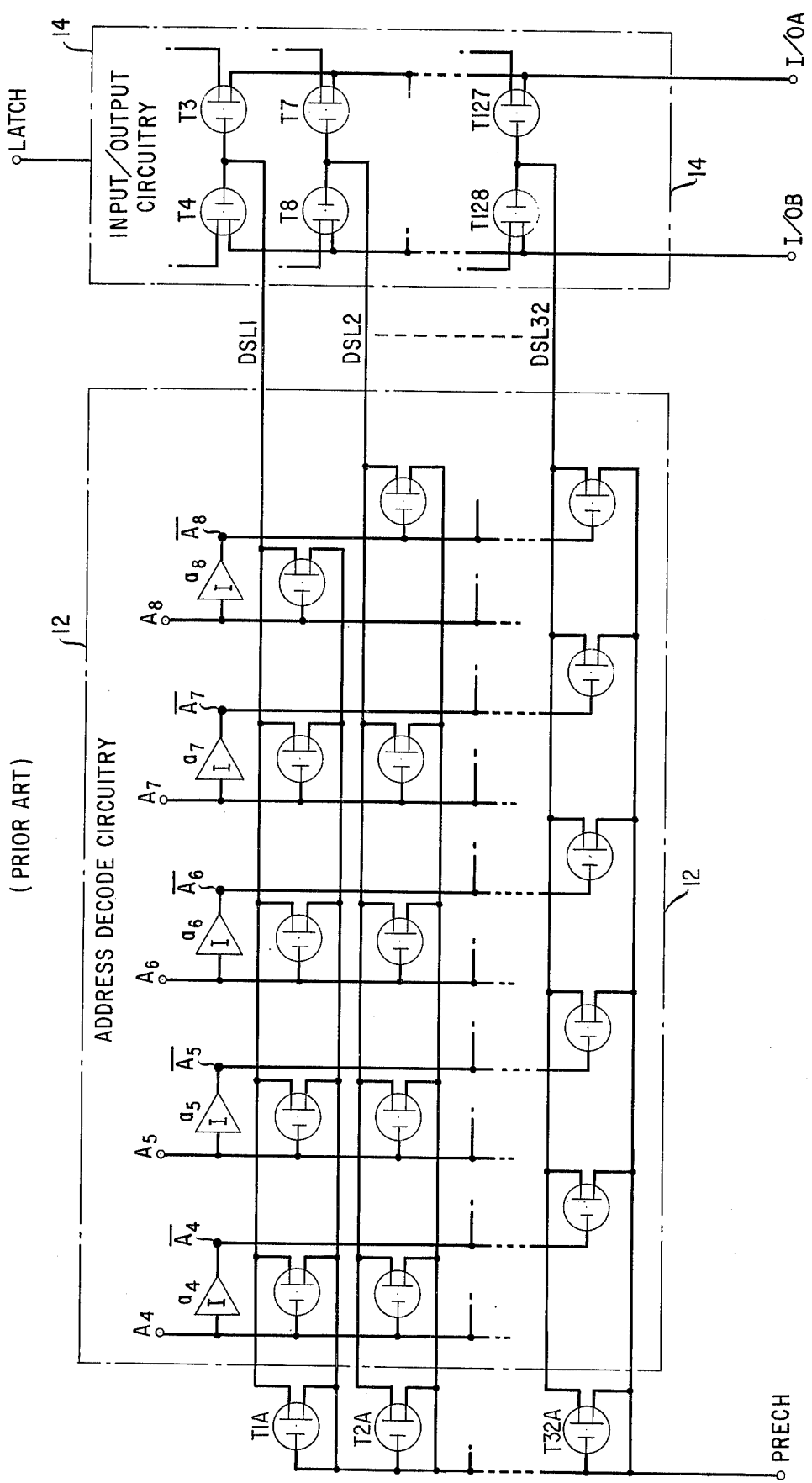
FIG. 1 illustrates prior art precharge circuitry.

Now referring to FIG. 1, there is illustrated prior art precharge circuitry made up of transistors T1A through T32A, address decode circuitry within dashed line rectangle 12, and input/output circuitry within dashed line rectangle 14. Such precharge circuitry has been used with a dynamic p-channel MOS 1024 bit memory system that is described in U.S. Pat. No. 3,825,771. For convenience, some of the same reference characters are being used herein as were used in that patent.

In the following description, an output terminal of a p-channel MOS transistor connected to a low level power supply will be denoted as the drain, and conversely, an output terminal connected to a high level power supply will be denoted as the source.

Address information, which is applied to input terminals A4–A8 are inverted by inverters a4–a8, and results in complementary outputs $\overline{\text{A4}}$–$\overline{\text{A8}}$. The address decode circuitry comprises five MOS transistors per row. This allows for the selection of one out of 32 data select lines (DSLs). The source of each of the five transistors of each row is connected to a separate data select line (DSL) and to the source of a separate one of the precharge transistors. The gate and drain of each precharge transistor are connected to the drains of the five transistors of the row of transistors associated therewith. The drains and gates of the precharge transistors T1A through T32A are connected together to a terminal denoted as PRECH. The PRECH terminal is connected to a voltage pulse generator (not illustrated) that generates a PRECH signal. The source of each precharge transistor is connected to a separate one of the DSLs which are connected to the input/output circuitry contained within dashed line rectangle 14. Each DSL is connected to the gates of a separate pair of transistors such as T3 and T4 of the input/output circuitry as shown.

For p-channel MOS transistors, a low level potential (e.g., 0 volts) enables, and a high level potential (e.g., +10 volts) disables. Assuming all the MOS transistors of FIG. 1 are p-channel, when the PRECH signal is at the low level, all the DSLs are charged to approximately one threshold voltage (approximately 1 to 2 volts) above 0 volts. At this point in time the address input signals applied to terminals A4–A8 are all typically at the high level and inverters a4–a8 are typically disabled such that the respective outputs $\overline{\text{A4}}$–$\overline{\text{A8}}$ are also at the high level. This results in no dc current drain on the voltage pulse generator (not illustrated) used to generate PRECH. The PRECH signal is now pulsed from 0 volts to approximately +10 volts. This disables all the precharge transistors and thus allows the DSLs to float in potential at the set value of approximately one threshold voltage above 0 volts. All of the pairs of transistors of the input/output circuitry contained within dashed line rectangle 14 are therefore still enabled. The DSLs are illustrated connected to the input/output circuitry contained within dashed line rectangle 14. This in effect makes the DSLs bit selection lines. If the DSLs are coupled to word line driver circuitry instead of input/output circuitry then the DSLs would be considered word selection lines.

Address logic information is now applied to the A4–A8 input terminals and the inverters a4–a8 are activated. Address input signals may be applied to A4–A8 before PRECH is brought to VH provided that the $\overline{\text{A4}}$–$\overline{\text{A8}}$ signals have stabilized to their valid logic levels before PRECH is brought to VH. The combination of the logic information and the address decode circuit configuration allows only one DSL to remain selected. At least one of the five transistors of each of the nonselected rows is enabled. All of the nonselected DSLs are thus charged to +10 volts. Each of the five transistors of the selected row remain disabled and accordingly, the potential of the selected DSL remains at approximately one threshold voltage above 0 volts. This selects the transistor pair of the input/output circuitry connected to the selected DSL and thereby facilitates the reading or writing of information into or out of any selected memory cell (not illustrated) associated with the memory system.

The transistors of the input/output circuitry introduce a second threshold voltage loss which limits the output voltage signal level to a value between approximately +10 volts (the high voltage supply potential used with the memory system) and plus two threshold voltages above 0 volts (the low voltage supply potential used with the memory system). The loss of two threshold voltages decreases noise margin and limits the amount of current which flows through a given geometry MOS transistor of the input/output circuitry. In addition, the relatively large capacitance load of all the precharge transistors and the address decode transistors on the voltage pulse generator (not illustrated) which generates PRECH, slows down the response time of the entire memory system.

Figure 2:
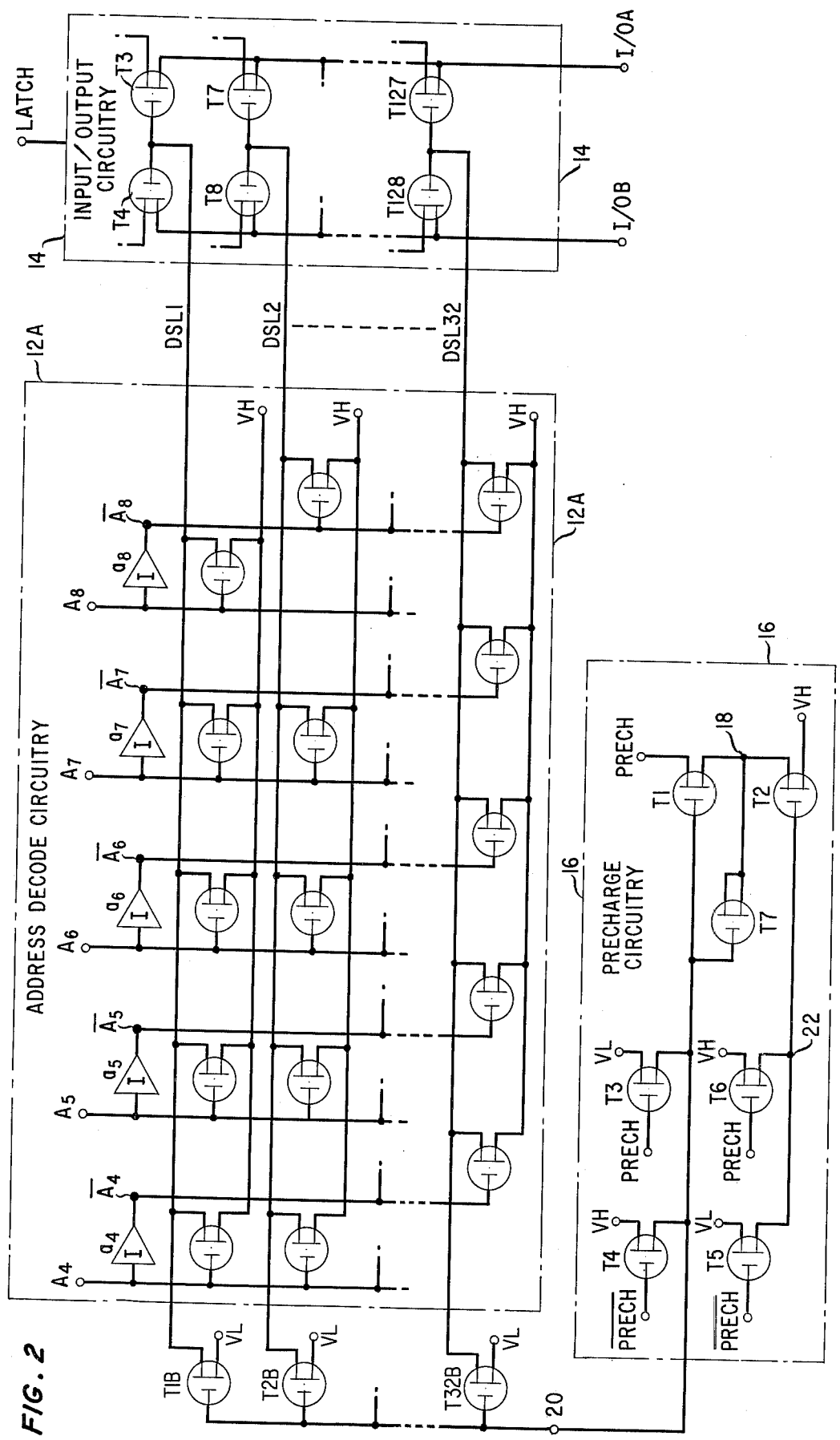
FIG. 2 illustrates precharge circuitry in accordance with an embodiment of the present invention.

Referring now to FIG. 2 there is illustrated within dashed line rectangle 16 precharge circuitry in accordance with the present invention. This circuitry comprises MOS transistors T1 through T7.

Output terminal 20 of circuitry 16 is connected to the gates of precharge transistors T1B through T32B. The precharge transistors T1B through T32B are essentially the same as the precharge transistors T1A through T32A of FIG. 1. However, the drains of these transistors are connected to a low power supply potential VL and the source of each transistor is connected to a separate one of the DSLs. The address decode circuitry contained within dashed line rectangle 12A is essentially identical to that contained within dashed line rectangle 12 in FIG. 1 except that the lower output terminals of all the address decode transistors associated therewith are sources because they are coupled to a high voltage power supply VH. The drains of each of the five address decode transistors of a given row are coupled to one of the DSLs. DSL1 through DSL32 of 12A are connected to the input/output circuitry contained within dashed line rectangle 14 in the same manner as illustrated in FIG. 1.

The modifications of the precharge transistors and address decode transistor connections are not essential to the operation of the precharge circuitry within dashed line rectangle 16. One advantage of the modifications is that the capacitive load on terminal 20 is lower than that on the voltage pulse generator (not illustrated) which generates PRECH of FIG. 1, and therefore there can be a faster response time.

As will be explained in detail later, the output signal level appearing at terminal 20 of the precharge circuitry contained within dashed line rectangle 16 is selectively varied between VH (PRECH is high and $\overline{\text{PRECH}}$ is low) and at least one threshold voltage below VL (PRECH is low and $\overline{\text{PRECH}}$ is high). When the voltage of output terminal 20 is at its lowest potential level (VL minus at least one threshold voltage), transistors T1B through T32B are all enabled and DSL1 through DSL32 are all charged to the VL potential. At this point in time all signal information to inputs A4-A8 is typically at the high voltage level and a4-a8 are typically disabled such that $\overline{\text{A4-A8}}$ are all at the high voltage level. Valid address information is typically applied to input terminals A4-A8 after the DSLs are set in potential to the VL level. Inverters a4-a8 are activated and output terminal 20 is charged to the high potential level VH. This disables T1B through T32B. At least one of the five address decode transistors of each of the nonselected rows becomes enabled such that the DSL associated therewith is charged to the VH level. The selected data select line (DSL) remains floating in potential at the VL level since all of the five address select transistors connected thereto remain disabled. Thus only the transistor pair of the input/output circuitry contained within dashed line rectangle 14 that is connected to the selected DSL remains enabled and can conduct current therethrough.

Address signal information may be applied to A4-A8 and inverters a4-a8 may be activated before the DSLs are set in potential to the VL level. In this case only the selected DSL charges to the VL level with the nonselected DSLs being held high by voltage division between the address decode transistors and the precharging transistors (the Beta of the address decode transistors are selected to be greater than the Betas of the precharging transistors). When output terminal 20 is brought high the address selection dictated by the input address signals is maintained with the selected DSL left floating in potential at the VL level and the nonselected DSLs charging completely to the VH level.

In the precharge circuitry contained within dashed line rectangle 16, the source of T1, drain of T2, and the drain and source of T7 are all connected together to node 18. The gate of T1 is connected to the gate of T7, the source of T3, the drain of T4, and output terminal 20. The gate of T2 is connected to the source of T5, the drain of T6, and to node 22. The sources of T2, T4, and T6 are all coupled to a fixed high voltage potential denoted as VH. The drains of T3 and T5 are both coupled to a fixed low voltage potential denoted as VL. The gates of T3 and T6 and the drain of T1 are all coupled to an input signal denoted as PRECH. The gates of T4 and T5 are both connected to an input $\overline{\text{PRECH}}$ signal which is essentially an inverted PRECH signal. T7 is connected so as to function as a capacitor. The gate of T7 serves as one terminal of the capacitor and the drain and source serve as the other terminal of the capacitor. When the polarity and magnitude of the potential applied to the gate of T7 are sufficient to establish a channel inversion layer beneath the gate, and therefore between the source and drain, the capacitance between the gate and the source-drain is significantly higher than when there is no channel established. When a channel is established between the source and drain of an MOS transistor that transistor will be denoted as enabled and conversely when there is no channel established the transistor will be denoted as disabled. The PRECH input signal is digital with a high level equal in potential to VH and a low level equal in potential to VL.

The precharge circuitry within dashed line rectangle 16 typically uses the following operating cycle: Assume that the transistors T1 through T7 are all p-channel transistors, VH = +10 volts and VL = 0 volts (ground potential), and that the PRECH input signal is initially at +10 volts and that the $\overline{\text{PRECH}}$ input signal is at 0 volts. Initially, output terminal 20 is charged in potential to approximately +10 volts because T4 is enabled and T3 is disabled. Node 22 is charged in potential to one threshold voltage above 0 volts because T5 is enabled and T6 is disabled. These conditions disable T1 and enable T2. Node 18 therefore assumes the +10 volt level of the source of T2. T7 is disabled and as a consequence the capacitance between the gate and drain-source is significantly lower than when T7 is enabled.

The PRECH and $\overline{\text{PRECH}}$ input signals now reverse with PRECH going to 0 volts and $\overline{\text{PRECH}}$ going to +10 volts. This enables T3 and T6, and node 20 discharges via T3 from +10 volts to plus one threshold voltage above 0 volts. This enables T1 which then tries to pull the potential of node 18 towards two threshold voltages above 0 volts. The transconductance (or, equivalently, the "Beta" value) of T1 is selected to be less than that of T2. The Beta of T6 is selected to be significantly less than that of T3, and the Betas of T3, T4, and T5 are all selected to be essentially equal. Because of the Beta differences of T3 and T6, output terminal 20 discharges to nearly 0 volts plus one threshold before the potential of node 22 changes significantly from the initial level of 0 volts plus one threshold level. The timing of this charging process is achieved because the low-to-high time constant associated with node 22 is greater than the high-to-low time constant associated with output terminal 20. This condition is achieved because the Beta difference between T6 and T3 slows the response time of node 22 as compared to output terminal 20. This timing condition can also be achieved with T3 and T6 having essentially equal Betas but with additional capacitive loading added to node 22.

T1 and T2 are simultaneously enabled during the initial phase of the transistion of the potential of terminal 20. The voltage of terminal 18 stays close to +10 volts during conduction through T1 and T2 because T2 has a greater Beta than T1.

As the potential on terminal 22 changes from plus one threshold voltage above 0 volts to +10 volts and T2 becomes disabled, terminal 18 falls in potential from +10 volts towards the 0 voltage potential now being applied to the drain of T1. This negative going waveform appearing at terminal 18 is capacitively coupled through the now enabled T7 to output terminal 20. This causes output terminal 20 to drop in value to a potential which is at least one threshold voltage below 0 volts.

The precharge circuitry contained within dashed line rectangle 16 causes the potential of the gate of a selected pair of transistors of the read/write circuitry illustrated within dashed line rectangle 14 to be charged via T1B to T32B to 0 volts and not just to within one threshold voltage of 0 volts. This allows for increased noise margin or a decrease in potential levels of the power supplies and a trade off between increased output current or a reduction in the geometries of the transistor pairs of the read/write circuitry.

It is to be noted that only one external voltage pulse (e.g., PRECH) is necessary to operate the precharge circuitry of this invention ($\overline{\text{PRECH}}$ is an inverted PRECH signal). The capacitive load on the voltage pulse generator (not illustrated) which creates the PRECH signal of FIG. 2 is essentially only the loading of node 18, the gates of T3 and T6, and the inverter (not illustrated) used to generate $\overline{\text{PRECH}}$. On the other hand the capacitive load on the voltage pulse generator which creates the PRECH signal of FIG. 1 is the drains and gates of all of the precharge transistors and the drains of the address decode transistors. This reduced capacitive load on terminal 20 as compared to the PRECH terminal in FIG. 1 facilitates a faster operation. Still further, the power to charge/discharge terminal 20 comes via the dc power supplies VH and VL and not the voltage pulse generator (not illustrated). Power supplies usually have low output impedances and therefore can charge or discharge a circuit node fairly rapidly.

The PRECH and $\overline{\text{PRECH}}$ signals can both be low or high for short periods of time because of the delay time of a circuit inverter (not illustrated) used to generate $\overline{\text{PRECH}}$ from PRECH. With PRECH and $\overline{\text{PRECH}}$ both low, (as might be the case near the beginning of the described cycle when PRECH goes from VH to VL and $\overline{\text{PRECH}}$ has not yet started to rise to VH from VL) node 22 stays relatively close in potential to VL plus one threshold voltage since T5 and T6 are both enabled and T5 has a much lower impedance than T6. Terminal 20 drops in potential to a value approximately midway between VH and VL since T3 and T4 are enabled and have essentially the same impedance. There are therefore no undesired effects in the initial phase of the transistions of nodes 18, 20, and 22.

With PRECH and $\overline{\text{PRECH}}$ both at VH (as might be the case at the end of a cycle when PRECH goes from VL to VH and $\overline{\text{PRECH}}$ has not yet discharged from VH to VL) T3, T4, T5, and T6 are all disabled, and accordingly, the potentials of terminal 20 and node 22 remain at essentially the values they were previously set to. When $\overline{\text{PRECH}}$ goes low, terminal 20 assumes a VH potential and node 22 assumes a potential of one threshold voltage above VL. Thus, it is apparent that even if the PRECH and $\overline{\text{PRECH}}$ signals are both simultaneously high or low for a short period of time there is no harm to the operation of the precharge circuitry contained within dashed line rectangle 16 of FIG. 2.

The embodiments described herein are intended to be illustrative of the general embodiments of the invention. Various modifications are possible consistent with the spirit of the invention. For example, n-channel MOS transistors can be substituted for the p-channel MOS transistors providing the appropriate potential and pulse polarities are utilized. With n-channel MOS transistors the threshold voltage loss affects the "1" level in that a threshold drop will make the "1" level less positive than the potential of the highest available power supply. Thus with n-channel MOS transistors the precharge circuitry of the present invention would cause the potential of the output terminal to be set to a value which is at least one threshold voltage above the potential of the high power supply. The precharge circuitry can be used to precharge the address select lines of the memory system described in U.S. Pat. No. 3,825,771. Still further, the precharge circuitry can be used in a variety of applications other than memory systems.

What is claimed is:

1. Circuitry comprising:
   first and second switching devices, each device having a control terminal and first and second output terminals;
   first and second voltage setting means connected to the control terminal of the first switching device and to a first circuit node;
   capacitor means having first and second terminals, the first and second terminals connected to the control terminal and second output terminal of the first switching means, respectively;
   the second output terminal of the first switching device connected to the first output terminal of the second switching device means;
   third and fourth voltage setting means connected to the control terminal of the second switching device and to a second circuit node;

the combination of the first and second voltage setting means and the first switching device resulting in the first circuit node being characterized by a first charge/discharge time constant;

the combination of the third and fourth voltage setting means and the second switching device resulting in the second circuit node being characterized by a second charge/discharge time constant; and the first charge/discharge time constant being smaller than the second charge/discharge time constant whereby the first circuit node can discharge from a high voltage level to a low voltage level before the second control terminal can charge from a low voltage level to a high voltage level.

2. The apparatus of claim 1 wherein the first, second, third, and fourth voltage setting means and the capacitor means each comprise a separate switching device.

3. Precharge circuitry comprising:

first, second, third, fourth, fifth, and sixth switching devices, each device having a control terminal and first and second output terminals;

capacitor circuit means having first and second terminals;

the second output terminals of the third and fourth switching devices, the control terminal of the first switching device, the first terminal of the first switching device, the first terminal of the capacitor circuit means, and an output terminal all connected together;

the second terminal of the capacitor means connected to the first terminal of the second switching device and to the second terminal of the first switching device;

the second terminals of the fifth and sixth switching devices connected to the control terminal of the second switching device; and the control terminals of the third, fourth, fifth, and sixth transistors and the first output terminal of the first switching device being adapted to serve as the input terminals.

4. The apparatus of claim 3 wherein each of the switching devices is an MOS transistor and the capacitor means is an MOS transistor in which the gate serves as the first terminal and the drain and source serve as the second terminal.

5. The apparatus of claim 4 wherein the transconductance of the second switching device is greater than that of the first switching device.

6. The apparatus of claim 5 wherein the first output terminals of the third, fourth, fifth, and sixth transistors and the second output terminal of the second transistor are all adapted to be coupled to essentially fixed voltage potentials.

7. The apparatus of claim 6 further comprising another MOS transistor having the gate thereof coupled to the output terminal.

8. Circuitry comprising:

first and second switching devices, each device having a control terminal and first and second output terminals;

the transconductance of the first switching device being less than that of the second switching device;

capacitive circuit means having a first terminal connected to the control terminal of the first switching device and having a second terminal connected to the second output terminal of the first device and to the first output terminal of the second device;

first and second voltage setting circuit means connected to the control terminal of the first device for periodically setting the potential thereof to one of two preselected levels; and third and fourth voltage setting circuit means coupled to the control terminal of the second switching device for periodically setting the potential thereof to one of two preselected levels, the fourth voltage setting circuit means being characterized in that the response time thereof is lower than that of the first voltage setting circuit means.

9. Circuitry comprising:

MOS circuit means responsive to an input signal or the complement thereof for periodically causing an output terminal of the circuitry to be set to a first potential which is within approximately one threshold voltage of the potential of an available power supply; and circuit means responsive to the first input signal or the complement thereof and coupled through capacitive means to the output terminal for periodically causing the output terminal to be set to a second potential which is more positive or more negative than the potential of the available power supply only after the output terminal has been set to the first potential.

* * * * *